United States Patent
Shibata (10) Patent No.: US 7,812,378 B2
(45) Date of Patent: Oct. 12, 2010

(54) SEMICONDUCTOR DEVICE WITH HIGH CAPACITANCE AND LOW LEAKAGE CURRENT

(75) Inventor: Yoshiyuki Shibata, Shiga (JP)

(73) Assignee: Panasonic Corporation, Osaka (JP)

( * ) Notice: Subject to any disclaimer, the term of this patent is extended or adjusted under 35 U.S.C. 154(b) by 30 days.

(21) Appl. No.: 12/172,583

(22) Filed: Jul. 14, 2008

(65) Prior Publication Data

US 2009/0050950 A1   Feb. 26, 2009

(30) Foreign Application Priority Data

Aug. 22, 2007   (JP) .............................. 2007-216120

(51) Int. Cl.
  H01L 29/772  (2006.01)
  H01L 29/92   (2006.01)
  H01L 29/94   (2006.01)

(52) U.S. Cl. .............................. 257/288; 257/E29.345; 438/197; 438/510

(58) Field of Classification Search ................. 257/288, 257/E29.111, 135, 297, E29.345, E21.09; 438/197, 510, 514, 527, 532, 394
See application file for complete search history.

(56) References Cited

U.S. PATENT DOCUMENTS 6,486,012 B1 * 11/2002 Ono .............................. 438/199
2002/0113294 A1 * 8/2002 Rhee et al. .................. 257/616
2005/0048708 A1   3/2005 Yamada et al.
2006/0065934 A1   3/2006 Okayama et al.

FOREIGN PATENT DOCUMENTS

JP    05-291538      11/1993
JP    2000-195966     7/2000
JP    2002-343879    11/2002

* cited by examiner

*Primary Examiner*—Matthew S Smith
*Assistant Examiner*—Michele Fan
(74) *Attorney, Agent, or Firm*—McDermott Will & Emery LLP (57) ABSTRACT

A semiconductor device includes a first MOS type capacitor having a first insulating film and a first electrode that are formed on a semiconductor substrate, and a second MOS type capacitor having a second insulating film and a second electrode that are formed on the semiconductor substrate. The first electrode has a first concentration difference as a difference when an impurity concentration in an interface region with the first insulating film is subtracted from an impurity concentration in a top portion of the first electrode. The second electrode has a second concentration difference as a difference when an impurity concentration in an interface region with the second insulating film is subtracted from an impurity concentration in a top portion of the second electrode. The second concentration difference is larger than the first concentration difference.

18 Claims, 10 Drawing Sheets

SEMICONDUCTOR DEVICE WITH HIGH CAPACITANCE AND LOW LEAKAGE CURRENT

BACKGROUND OF THE INVENTION

1. Field of the Invention

The invention relates to a semiconductor device having, for example, a MOS (Metal Oxide Semiconductor) type capacitor and a manufacturing method thereof.

2. Related Art

Figure 9A:
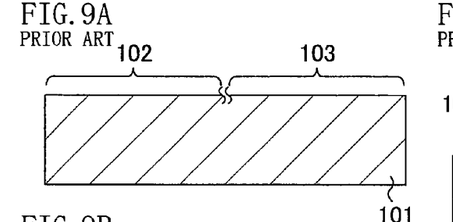
FIGS. 9A, 9B, 9C, 9D, 9E, 9F, 9G, 9H, 9I, and 9J are cross-sectional views illustrating a method for manufacturing a conventional semiconductor device.

With recent improvement in integration and functionality of semiconductor integrated circuit devices, higher capacitance and lower leakage current characteristics have been required for MOS type capacitor elements (MOS type capacitors). However, it is difficult to satisfy these two characteristics with the same MOS type capacitor. Therefore, it has been considered to form a capacitor having a high capacitance value (high capacitance capacitor) and a capacitor having a low leakage current value (low leakage current capacitor) depending on the applications in order to implement a MOS type capacitor satisfying the two characteristics. A typical method for forming these two kinds of capacitors is to form a thin insulating film for a high capacitance capacitor and a thick insulating film for a low leakage current capacitor. Hereinafter, a method for manufacturing such a conventional MOS type capacitor will be described with reference to the figures. FIGS. 9A through 9J are cross-sectional views illustrating the method for manufacturing the conventional MOS type capacitors. Note that, as shown in FIG. 9A, a semiconductor substrate 101 has a first region 102 where a low leakage current capacitor is to be formed, and a second region 103 where a high capacitance capacitor is to be formed.

Figure 9B:
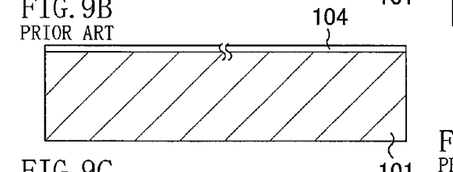
Figure 9C:
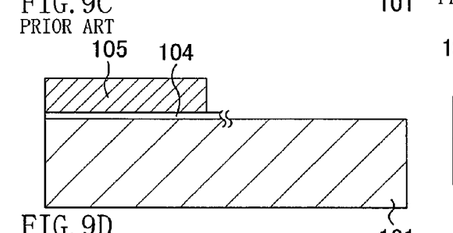

As shown in FIG. 9B, an insulating film 104 is formed on the semiconductor substrate 101 by oxidation or the like. As shown in FIG. 9C, a resist pattern 105 is formed on the insulating film 104 in the first region 102, and then the insulating film 104 in the second region 103 is selectively removed.

Figure 9D:
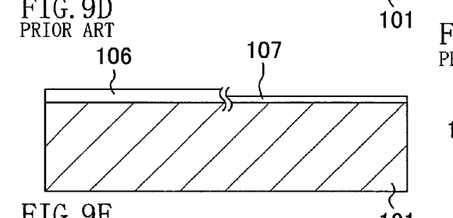

As shown in FIG. 9D, after the resist pattern 105 is removed, a first insulating film 106 is formed on the semiconductor substrate of the first region 102 by, for example, oxidizing the insulating film 104 and a second insulating film 107 is formed on the semiconductor substrate of the second region 103. The thickness of the first insulating film 106 is larger than that of the second insulating film 107.

Figure 9E:
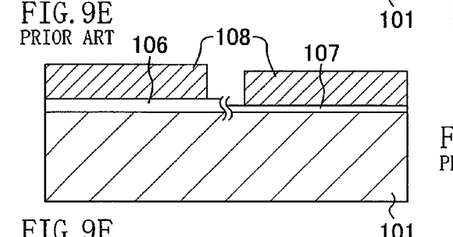
Figure 9F:
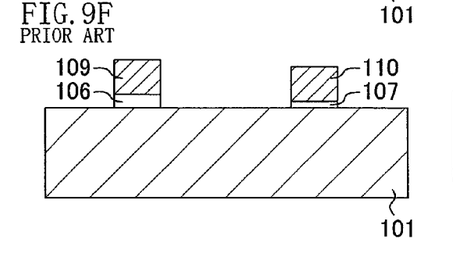

As shown in FIG. 9E, a silicon film 108, for example, is then formed over the whole surface of the semiconductor substrate 101. As shown in FIG. 9F, the silicon film 108, the first insulating film 106, and the second insulating film 107 are patterned by lithography and dry etching to form a first electrode 109 on the first insulating film 106 of the first region 102 and a second electrode 110 on the second insulating film 107 of the second region 103. A low leakage current MOS capacitor is thus formed in the first region 102 and a high capacitance MOS capacitor is formed in the second region 103.

Figure 9G:
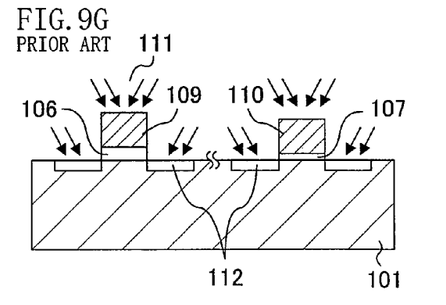

As shown in FIG. 9G, impurities are implanted to the first electrode 109 and the second electrode 110 by ion implantation. At this time, impurities 111 are implanted also to a region located beside the first electrode 109 and the second electrode 110 in the semiconductor substrate 101 when viewed two-dimensionally. As a result, an impurity region 112 is formed. Note that, in a normal semiconductor device having a MOS type capacitor mounted thereon, not only a capacitor but elements such as a MOS transistor are formed simultaneously. Accordingly, for example, an extension region, an LDD (Lightly Doped Drain) region, and a pocket region of a transistor are formed simultaneously by this ion implantation.

Figure 9H:
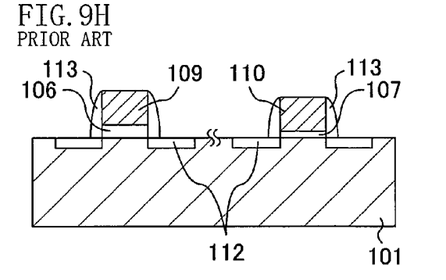

As shown in FIG. 9H, after an insulating film is formed over the whole surface of the semiconductor substrate 101, the insulating film is selectively removed by dry etching to form a sidewall 113 on the respective side surfaces of the first electrode 109 and the first insulating film 106 and on the respective side surfaces of the second electrode 110 and the second insulating film 107. Note that, for example, a sidewall of a MOS transistor is formed simultaneously in this step.

Figure 9I:
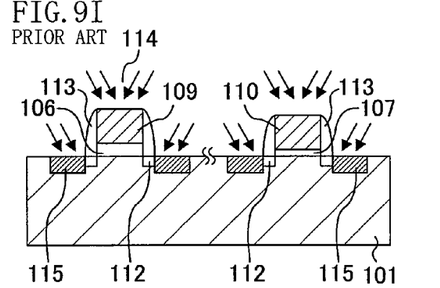

As shown in FIG. 9I, ion implantation is performed in the first region 102 and the second region 103, whereby impurities 114 are further introduced into the first electrode 109 and the second electrode 110. At this time, impurities are also implanted to a region located beside the first electrode 109 and the second electrode 110 in the semiconductor substrate 101 when viewed two-dimensionally. As a result, a high concentration impurity region 115 is formed. For example, source/drain regions of a MOS transistor are formed simultaneously in this step.

Figure 9J:
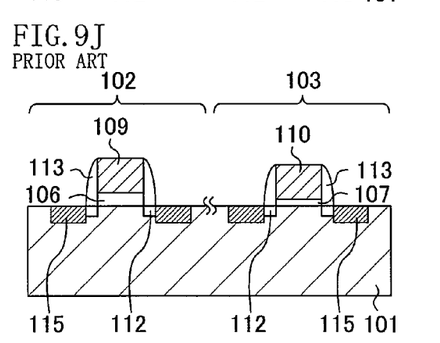

As shown in FIG. 9J, the semiconductor substrate 101 is subjected to heat treatment such as RTA (Rapid Thermal Annealing) or LSA (Laser Spike Annealing) to activate the impurities implanted in each layer. The conventional MOS type capacitor having a low leakage current capacitor and a high capacitance capacitor in the first region 102 and the second region 103, respectively, can be manufactured by the above method.

Figure 10A:
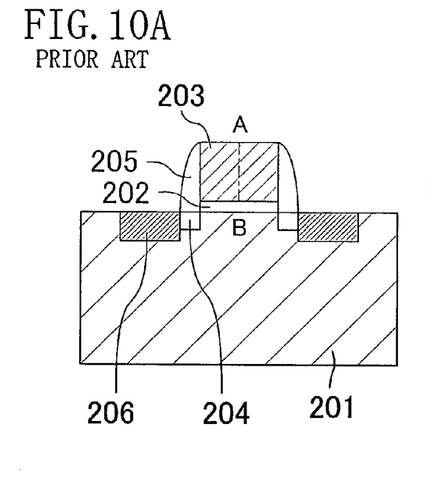
FIG. 10A is a cross-sectional view showing a structure of a commonly used MOS type capacitor.

Hereinafter, characteristics of a commonly used MOS type capacitor will be described with reference to FIGS. 10A through 10E. FIG. 10A is a cross-sectional view showing a structure of a commonly used MOS type capacitor.

As shown in FIG. 10A, a commonly used MOS type capacitor includes a semiconductor substrate 201, an insulating film 202 and an electrode 203 that are formed on the semiconductor substrate 201, a sidewall 205 formed on the respective side surfaces of the insulating film 202 and the electrode 203, and an impurity region 204 and a high concentration impurity region 206 that are formed in the semiconductor substrate 201. The impurity region 204 and the high concentration impurity region 206 are respectively formed beside the electrode 203 and the sidewall 205 when viewed two-dimensionally. When a voltage is applied to the MOS type capacitor, a depletion layer is formed in the semiconductor substrate 201 or the electrode 203. This changes the electrical thickness of the insulating film (electrical insulating film thickness) and thus changes the capacitance value and leakage current value of the capacitor.

Figure 10B:
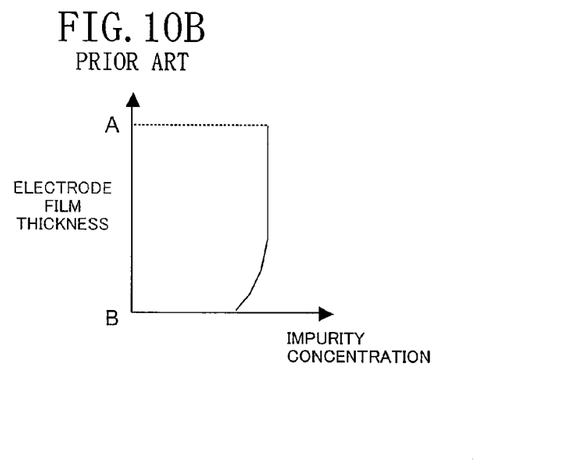
FIG. 10B shows impurity concentration distribution in an electrode of the commonly used MOS type capacitor.

FIG. 10B shows an impurity concentration distribution in the electrode 203. Note that FIG. 10B shows an impurity concentration in a region from the top surface to the bottom surface of the electrode 203 (between A and B). Impurities are introduced into the electrode 203 by ion implantation. Therefore, in the impurity distribution between A and B in the electrode 203, an impurity concentration reduces toward the bottom surface of the electrode 203, as shown in FIG. 10B.

Figure 10C:
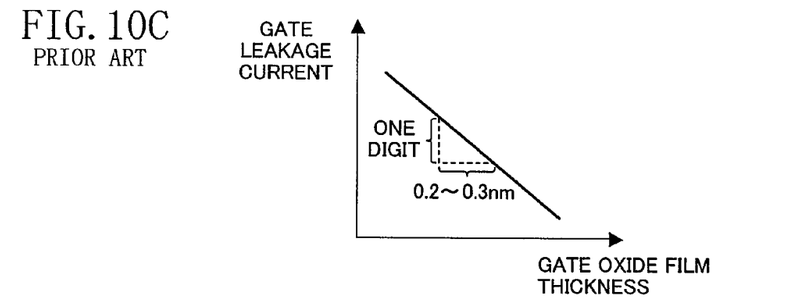
FIGS. 10C and 10D show a leakage current value and capacitance value of the MOS type capacitor with respect to the electrical insulating film thickness, respectively.

FIG. 10C shows a leakage current value of the MOS type capacitor with respect to the electrical insulating film thickness (gate oxide film thickness). As shown in FIG. 10C, a leakage current reduces with increase in the electrical insulating film thickness. More specifically, as the thickness is increased by about 0.2 nm to about 0.3 nm, the leakage current value reduces by about one digit. It can be seen from FIG. 10C that the leakage current value significantly changes with a slight change in the film thickness.

Figures 10D, 10E:
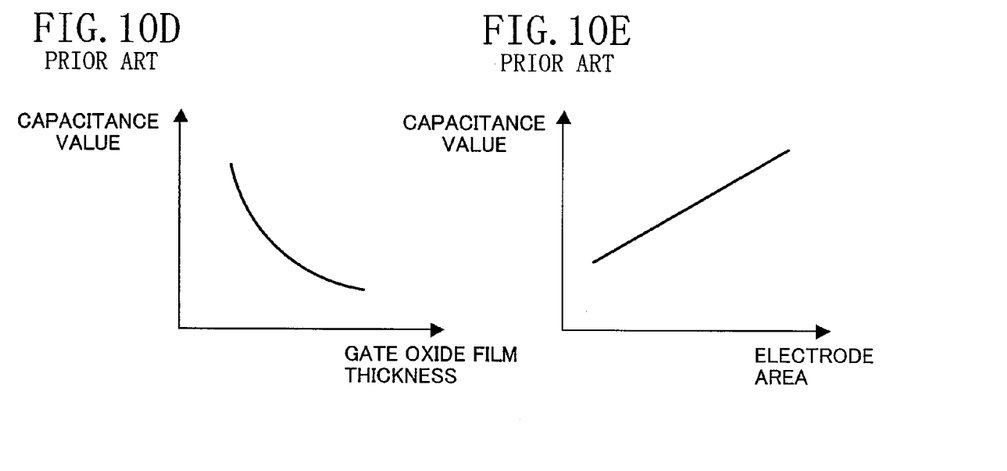
FIG. 10E shows a capacitance value of the MOS type capacitor with respect to the electrode area.

FIG. 10D shows a capacitance value of the MOS type capacitor with respect to the electrical insulating film thickness (gate oxide film thickness). The capacitance value (C) of the capacitor is generally shown by $C \propto e \times e_0 \times S/d$, where e is a relative dielectric constant, $e_0$ is a dielectric constant, S is an area, and d is an insulating film thickness. This formula shows that the insulating film thickness (d) is inversely proportional to the capacitance value (C), and the capacitance value reduces with increase in the insulating film thickness.

As described above, the electrical insulating film thickness and the leakage current value and the capacitance value have the above relation. Therefore, as shown in FIG. 9J, a semiconductor device including a capacitor having a high capacitance value and a suppressed leakage current is conventionally implemented by forming insulating films having different thicknesses from each other on the same semiconductor substrate.

FIG. 10E shows a capacitance value with respect to the electrode area. It can be seen from the above formula of the capacitance value (C) and from FIG. 10E that the capacitance value is proportional to the area. Note that, in one proposed method, a high capacitance value is assured by forming a thick insulating film to suppress a leakage current and by increasing the electrode area in a high capacitance capacitor (see Japanese Laid-Open Patent Publication No. 2002-343879).

In another proposed method, after a MOS type capacitor is formed, an opening is formed in an interlayer insulating film formed in a formation region of a second MOS type capacitor, and an interlayer insulating film is formed again as an insulating film of the MOS type capacitor (see Japanese Laid-Open Patent Publication No. 2000-195966).

SUMMARY OF THE INVENTION

In a conventional manufacturing method of a semiconductor device, however, it is necessary to form a plurality of insulating films having different thicknesses from each other. Therefore, an additional oxidation step is required to form an insulating film having a different film quality, and impurities that are implanted into an electrode need to be sufficiently controlled in order to ensure reliability of an insulating film, which may complicate the process. Moreover, in the case where the capacitance value is assured by increasing the electrode area, the electrode occupies a large area in a semiconductor chip, which may inhibit dimensional reduction and may increase the cost.

In view of the above problems, it is an object of the invention to provide a semiconductor device that includes MOS type capacitors having low leakage current characteristics and high capacitance characteristics on the same semiconductor substrate and shows excellent capability, and a manufacturing method thereof.

In order to achieve the above object, a semiconductor device according to the invention includes a semiconductor substrate, a first MOS type capacitor, and a second MOS type capacitor. The first MOS type capacitor includes a first insulating film formed on the semiconductor substrate, and a first electrode formed on the first insulating film and including silicon. The first electrode has a first concentration difference as a difference when an impurity concentration in an interface region with the first insulating film is subtracted from an impurity concentration in a top portion of the first electrode. The second MOS type capacitor includes a second insulating film formed on the semiconductor substrate, and a second electrode formed on the second insulating film and including silicon. The second electrode has a second concentration difference as a difference when an impurity concentration in an interface region with the second insulating film is subtracted from an impurity concentration in a top portion of the second electrode. The second concentration difference is larger than the first concentration difference.

With this structure, the first electrode and the second electrode have different impurity concentration distributions from each other, and an impurity concentration near the bottom surface of the second electrode is lower than that near the bottom surface of the first electrode. Therefore, when a voltage is applied to each electrode, a depletion layer is more likely to expand near the bottom surface of the second electrode than near the bottom surface of the first electrode. As a result, the electrical thickness of the second insulating film is increased, whereby the second MOS type capacitor having the second insulating film becomes a capacitor having a suppressed leakage current. On the other hand, since the electrical thickness of the first insulating film is small, the first MOS type capacitor having the first insulating film becomes a capacitor having a high capacitance value. In the semiconductor device of the invention, a capacitor having a suppressed leakage current and a capacitor having a high capacitance value can thus be provided on the same substrate, whereby a high performance semiconductor device can be implemented.

A thickness of the first electrode may be smaller than a thickness of the second electrode. In this case, when impurities are introduced during formation of the first electrode and the second electrode, the impurities are less likely to reach the interface region with the second insulating film in the second electrode having a larger thickness. Therefore, the first electrode and the second electrode having different impurity concentration distributions from each other can be obtained.

The first electrode and the second electrode may include a metal. In this case, the first MOS type capacitor and the second MOS type capacitor can operate at a high speed. The first insulating film and the second insulating film may be made of a metal oxide. In this case, the first MOS type capacitor and the second MOS type capacitor having a further suppressed leakage current can be implemented.

According the invention, a first method for manufacturing a semiconductor device including a semiconductor substrate, a first MOS type capacitor including a first insulating film and a first electrode, and a second MOS type capacitor including a second insulating film and a second electrode includes the steps of: (a) after forming the first insulating film and the second insulating film on the semiconductor substrate, forming a first electrode formation film and a second electrode formation film, both including silicon, on the first insulating film and the second insulating film, respectively; (b) after forming a resist that covers the first electrode formation film, implanting impurities to the second electrode formation film; (c) after removing the resist, implanting conductive impurities to the first electrode formation film and the second electrode formation film; and (d) after the step (c), heat-treating the semiconductor substrate to form the first gate electrode in which a difference when an impurity concentration in an interface region with the first insulating film is subtracted from an impurity concentration in a top portion is a first concentration difference, and to form the second electrode in which a difference when an impurity concentration in an interface region with the second insulating film is subtracted from an impurity concentration in a top portion is a second concentration difference that is larger than the first concentration difference.

According to this method, the first electrode and the second electrode having different impurity concentration distributions from each other can be formed by implanting impurities only to the second electrode formation film in the step (b). As a result, in the second electrode in which the difference in impurity concentration between the top and the bottom is the second concentration difference that is larger than the first concentration difference, a depletion layer is more likely to expand in the interface region with the second insulating film upon voltage application. As a result, the electrical thickness of the second insulating film becomes larger than that of the first insulating film, whereby the second MOS type capacitor becomes a capacitor having a suppressed leakage current. On the other hand, since the electrical thickness of the first insulating film becomes smaller than that of the second insulating film, the first MOS type capacitor becomes a capacitor having a high capacitance value. Accordingly, by using the first manufacturing method of the invention, a capacitor having a suppressed leakage current and a capacitor having a high capacitance value can be formed on the same substrate without performing a complicated process such as varying the thickness of the insulating film between the capacitors. As a result, a semiconductor device showing excellent capability can be relatively easily manufactured.

According to the invention, a second method for manufacturing a semiconductor device including a semiconductor substrate, a first MOS type capacitor including a first insulating film and a first electrode, and a second MOS type capacitor including a second insulating film and a second electrode includes the steps of: (a) after forming the first insulating film and the second insulating film on the semiconductor substrate, forming a first electrode formation film and a second electrode formation film, both including silicon, on the first insulating film and the second insulating film, respectively; (b) removing an upper portion of the first electrode formation film so that a thickness of the first electrode formation film becomes smaller than a thickness of the second electrode formation film; (c) after the step (b), implanting conductive impurities to the first electrode formation film and the second electrode formation film; and (d) after the step (c), heat-treating the semiconductor substrate to form the first gate electrode in which a difference when an impurity concentration in an interface region with the first insulating film is subtracted from an impurity concentration in a top portion is a first concentration difference, and to form the second electrode in which a difference when an impurity concentration in an interface region with the second insulating film is subtracted from an impurity concentration in a top portion is a second concentration difference that is larger than the first concentration difference.

According to this method, the thickness of the second electrode formation film becomes larger than that of the first electrode formation film in step (b). Therefore, when impurities are implanted to each electrode in step (c), the impurities are less likely to reach the interface region with the second insulating film in the second electrode formation film. As a result, the first electrode and the second electrode having different impurity concentration distributions from each other can be obtained in step (d). Therefore, when a voltage is applied to each electrode, the electrical thickness of the second insulating film becomes larger than that of the first insulating film, as in the above-described first manufacturing method of the invention. The first MOS type capacitor and the second MOS type capacitor can thus have desired characteristics. By using the second manufacturing method of the invention, a low leakage current capacitor and a high capacitance capacitor can be formed on the same substrate without performing a complicated process. As a result, a semiconductor device showing excellent capability can be relatively easily manufactured.

DESCRIPTION OF THE PREFERRED EMBODIMENTS

First Embodiment

Figure 1A:
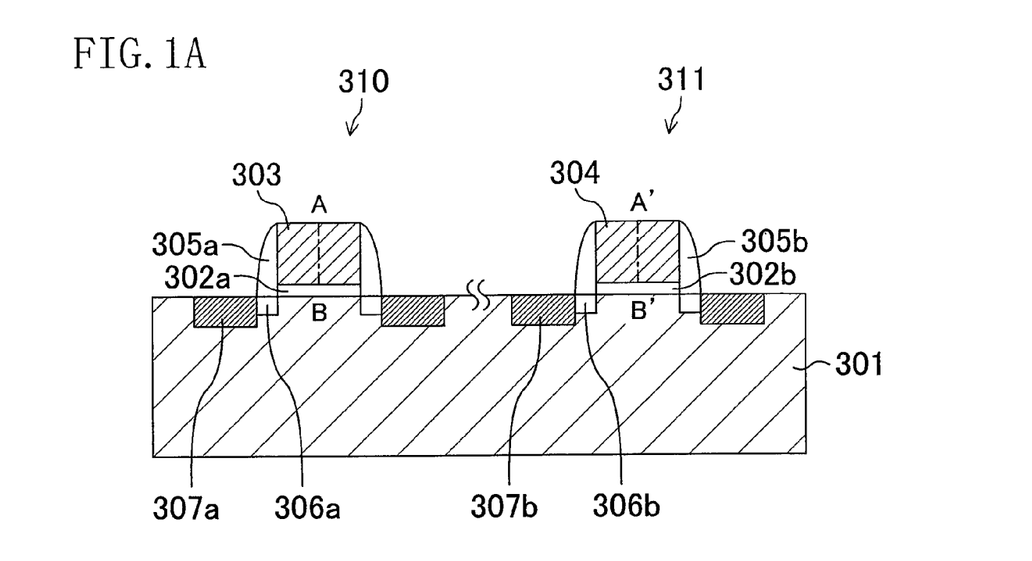
FIG. 1A is a cross-sectional view showing a structure of a semiconductor device according to a first embodiment of the invention.

Hereinafter, a semiconductor device and a manufacturing method thereof according to a first embodiment of the invention will be described with reference to the figures. FIG. 1A shows a structure of the semiconductor device according to this embodiment.

As shown in FIG. 1A, the semiconductor device of this embodiment includes a semiconductor substrate 301, and a first MOS type capacitor 310 and a second MOS type capacitor 311 that are formed on the semiconductor substrate 301. The first MOS type capacitor 310 includes a first insulating film 302a formed on the semiconductor substrate 301, a first electrode 303 formed on the first insulating film 302a, a sidewall 305a formed on the respective side surfaces of the first insulating film 302a and the first electrode 303, and an impurity region 306a and a high concentration impurity region 307a that are formed in the semiconductor substrate 301. The impurity region 306a and the high concentration impurity region 307a are respectively formed beside the first electrode 303 and the sidewall 305a when viewed two-dimensionally. Similarly, the second MOS type capacitor 311 includes a second insulating film 302b formed on the semiconductor substrate 301, a second electrode 304 formed on the second insulating film 302b, a sidewall 305b formed on the respective side surfaces of the second insulating film 302b and the second electrode 304, and an impurity region 306b and a high concentration impurity region 307b that are formed in the semiconductor substrate 301. The impurity region 306b and the high concentration impurity region 307b are respectively formed beside the second electrode 304 and the sidewall 305b when viewed two-dimensionally.

Figure 1B:
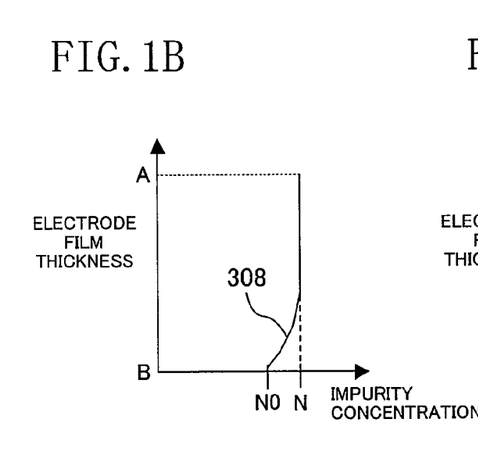
FIGS. 1B and 1C show impurity concentration distribution in a first electrode and a second electrode of the first embodiment, respectively.

Impurity concentration distribution in the first electrode 303 of the first MOS type capacitor 310 and the second electrode 304 of the second MOS type capacitor 311 will now be described with reference to FIGS. 1B and 1C. FIG. 1B shows an impurity concentration distribution 308 between A and B of the first electrode 303 of this embodiment shown in FIG. 1A. FIG. 1B shows an impurity concentration distribution 309 between A' and B' of the second electrode 304 of this embodiment shown in FIG. 1A. For comparison between the impurity concentration distributions 308 and 309, the impurity concentration distribution 308 in the first electrode 303 is shown also in FIG. 1C.

As shown in FIG. 1B, the first electrode 303 of the first MOS type capacitor 310 has approximately the same impurity concentration from the top to a position near the center. The impurity concentration hardly changes in this region. However, the impurity concentration gradually reduces from the position near the center toward the bottom. Provided that N is an impurity concentration at the top surface (A) and N0 is an impurity concentration at the bottom surface (B), N and N0 have, for example, the following values: $N=2\times10^{20}/cm^3$ and $N0=1\times10^{20}/cm^3$. In this case, the concentration difference (first concentration difference) when the impurity concentration N0 at the bottom surface (B) is subtracted from the impurity concentration N at the top surface (A) is about $1\times10^{20}/cm^3$.

Figure 1C:
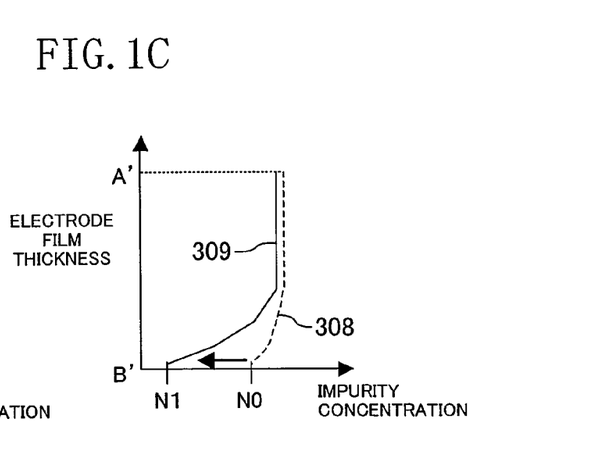

In the second electrode 304 of the second MOS type capacitor 311, on the other hand, as shown in FIG. 1C, the impurity concentration hardly changes from the top to a position near the center. However, the impurity concentration significantly reduces from the position near the center toward the bottom. Provided that N1 is an impurity concentration at the bottom surface (B') of the second electrode 304, N1 has, for example, the following value: $N1=1\times10^{19}/cm^3$. In this case, the impurity concentration N1 at the bottom surface (B') of the second electrode 304 is lower than the impurity concentration N0 at the bottom surface (B) of the first electrode 303 by about $9\times10^{19}/cm^3$. In other words, the concentration difference (second concentration difference) when the impurity concentration at the bottom surface (B') of the second electrode 304 is subtracted from the impurity concentration at the top surface (A') thereof is larger than the concentration difference (first concentration difference) when the impurity concentration at the bottom surface (B) of the first electrode 303 is subtracted from the impurity concentration at the top surface (A) thereof.

The semiconductor device of this embodiment is characterized in that the first electrode 303 and the second electrode 304 have different impurity concentration distributions from each other and that the impurity concentration at the bottom surface (B') of the second electrode 304 is lower than that at the bottom surface (B) of the first electrode 303, as shown in FIGS. 1B and 1C. Therefore, when a voltage is applied to each electrode, a depletion layer is more likely to expand near the bottom surface of the second electrode 304 (an interface region of the second electrode 304 and the second insulating film 302b) than near the bottom surface of the first electrode 303 (an interface region of the first electrode 303 and the first insulating film 302a). As a result, the electrical thickness of the second insulating film 302b is increased, whereby the second MOS type capacitor 311 having the second insulating film 302b becomes a capacitor having a suppressed leakage current. On the other hand, the electrical thickness of the first insulating film 302a is smaller than that of the second insulating film 302b. Therefore, the first MOS type capacitor 310 having the first insulating film 302a becomes a capacitor having a high capacitance value. In the semiconductor device of this embodiment, a capacitor having a suppressed leakage current and a capacitor having a high capacitance value can thus be provided on the same substrate, whereby a high performance semiconductor device can be implemented.

Figure 2A:
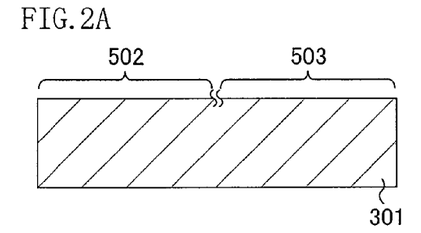
FIGS. 2A, 2B, 2C, 2D, 2E, 2F, 2G, 2H, and 2I are cross-sectional views illustrating a method for manufacturing a semiconductor device according to the first embodiment.

A manufacturing method of the semiconductor device having the above structure will now be described. FIGS. 2A through 2I are cross-sectional views illustrating the manufacturing method of the semiconductor device according to this embodiment. As shown in FIG. 2A, in the semiconductor device of this embodiment, the semiconductor substrate 301 has a first region 502 where a high capacitance capacitor is to be formed and a second region 503 where a low leakage current capacitor is to be formed.

Figures 2B, 2C:
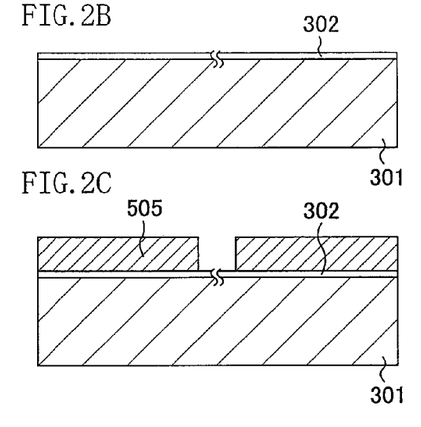

As shown in FIG. 2B, an insulating film 302 is first formed on the semiconductor substrate 301 by oxidation or the like. As shown in FIG. 2C, an electrode formation film 505 made of, for example, silicon is formed with a thickness of 200 nm on the insulating film 302.

Figure 2D:
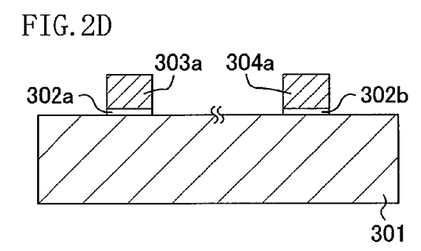

As shown in FIG. 2D, the insulating film 302 and the electrode formation film 505 are then patterned by lithography and dry etching to form a first insulating film 302a and a first electrode formation film 303a in the first region 502 and a second insulating film 302b and a second electrode formation film 304a in the second region 503.

Figure 2E:
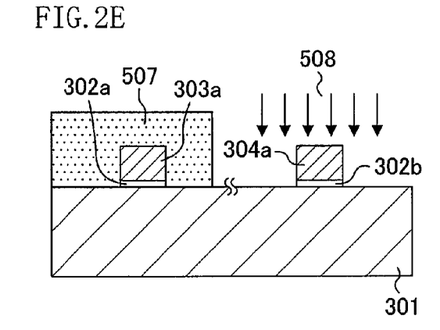

As shown in FIG. 2E, a resist pattern 507 is formed in the first region 502 so as to cover the first insulating film 302a and the first electrode formation film 303a. Impurities 508 such as nitrogen are then ion-implanted to the second region 503 at, for example, an implantation energy of 5 keV and a dose of $1\times10^{16}/cm^2$. Nitrogen 508 is thus distributed at a high concentration in the second electrode formation film 304. Note that the impurities 508 for ion implantation are not limited to nitrogen, and oxygen or fluorine may be used.

Figure 2F:
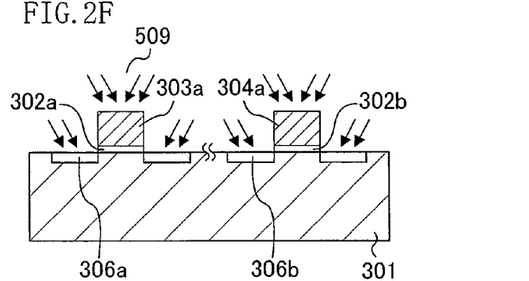

As shown in FIG. 2F, after the resist pattern 507 is removed, conductive impurities 509 such as arsenic or phosphorus are ion-implanted to the semiconductor substrate 301 to introduce the impurities 509 into the first electrode formation film 303a and the second electrode formation film 304a. At this time, the impurities 509 are introduced also into the regions respectively located beside the first electrode formation film 303a and the second electrode formation film 304a in the semiconductor substrate 301 when viewed two-dimensionally. As a result, impurity regions 306a and 306b are formed. Note that, the implantation conditions for arsenic are, for example, an implantation energy of 10 keV and a dose of $5\times10^{14}/cm^2$. In the semiconductor device of this embodiment, not only the MOS type capacitors but elements such as a MOS transistor are also provided on the same semiconductor substrate 301. For example, an extension region, an LDD region, and a pocket region of the MOS transistor are formed simultaneously by this ion implantation.

Figure 2G:
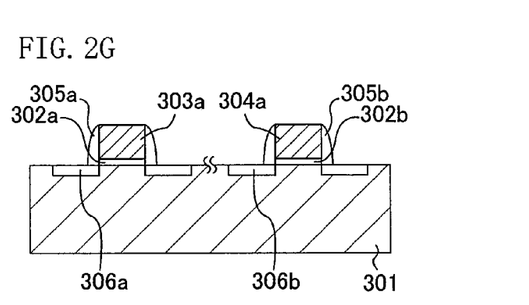

As shown in FIG. 2G, after an insulating film is formed over the whole surface of the semiconductor substrate 301, the insulating film is selectively removed by dry etching to form sidewalls 305a and 305b. The sidewall 305a is formed on the respective side surfaces of the first electrode formation film 303a and the first insulating film 302a, and the sidewall 305b is formed on the respective side surfaces of the second electrode formation film 304a and the second insulating film 302b. Note that a sidewall of the MOS transistor or the like provided on the same substrate is also formed simultaneously in this step.

Figure 2H:
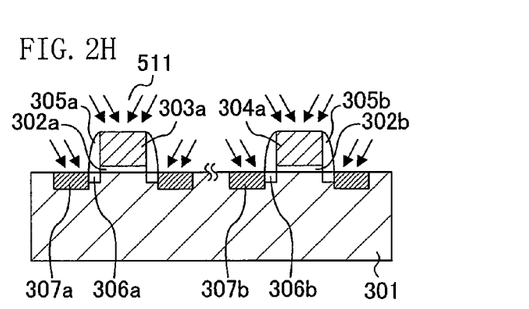

As shown in FIG. 2H, conductive impurities 511 such as arsenic or phosphorus are then ion-implanted to the semiconductor substrate 301 to further introduce the conductive impurities 511 into the first electrode formation film 303a and the second electrode formation film 304a. The first electrode formation film 303a and the second electrode formation film 304a thus become conductive electrodes. The ion implantation conditions for arsenic are, for example, an implantation energy of 20 keV and a dose of $5 \times 10^{15}/cm^2$. The impurities 511 are thus implanted at a larger dose than in the step of FIG. 2F. In this step, the impurities 511 are introduced also into the regions respectively located beside the first electrode formation film 303a and the second electrode formation film 304a in the semiconductor substrate 301 when viewed two-dimensionally. As a result, high concentration impurity regions 307a and 307b are formed. Note that, for example, the source and drain of the MOS transistor are also formed simultaneously in this step.

Figure 2I:
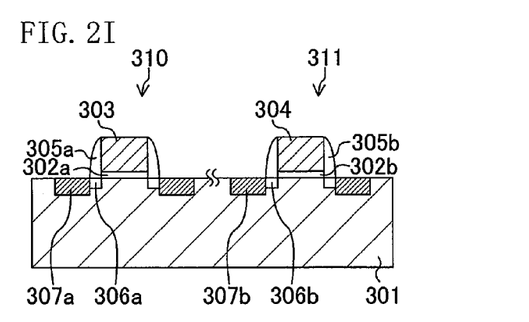

Finally, as shown in FIG. 2I, the semiconductor substrate 301 is subjected to heat treatment such as RTA (Rapid Thermal Annealing) at, for example, 1,000 degrees for 5 seconds to activate the impurities implanted in the first electrode formation film 303a, the second electrode formation film 304a, and each region. As a result, a first electrode 303 is formed on the first insulating film 302a in the first region 502, and a second electrode 304 is formed on the second insulating film 302b in the second region 503.

Figures 3A, 3B:
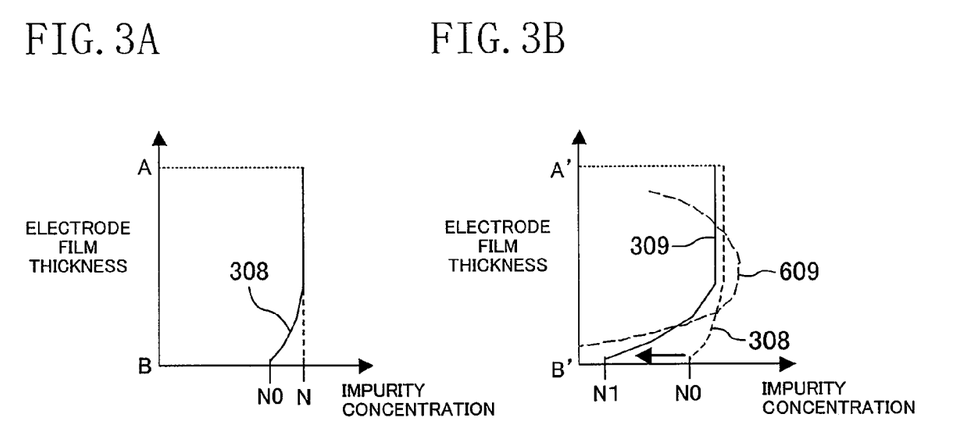
FIGS. 3A and 3B show impurity concentration distribution in the first electrode and the second electrode of the first embodiment, respectively.

The semiconductor device of this embodiment having a high capacitance capacitor (first MOS type capacitor 310) and a low leakage current capacitor (second MOS type capacitor 311) in the first region 502 and the second region 503, respectively, can thus be manufactured by the above method. The first electrode 303 of the low leakage current capacitor and the second electrode 304 of the high capacitance capacitor have the same impurity concentration distribution as that shown in FIGS. 1B and 1C, respectively. Hereinafter, the impurity concentration distributions in the first electrode 303 and the second electrode 304 will be described in detail with reference to FIGS. 3A and 3B. FIG. 3A shows the impurity concentration distribution 308 between A and B of the first electrode 303 shown in FIG. 1A. FIG. 3B shows the impurity concentration distribution 309 between A' and B' of the second electrode 304 shown in FIG. 1B.

As shown in FIGS. 3A and 3B, the impurity concentration at the bottom surface (B') of the second electrode 304 is lower than that at the bottom surface (B) of the first electrode 303. As shown in FIG. 3B, nitrogen 609 implanted in the step of FIG. 2E is included in the second electrode 304. This implantation of nitrogen prevents implanted impurities such as arsenic from reaching near the bottom surface of the second electrode 304 in the steps of FIGS. 2F and 2H. Therefore, the impurity concentration decreases significantly near the bottom surface (B') of the second electrode 304.

As described above, in the semiconductor device of this embodiment, the impurities 508 such as nitrogen are ion-implanted only to the second electrode 304 in the step of FIG. 2E. This enables formation of the first electrode 303 and the second electrode 304 having different impurity concentration distributions from each other. The impurity concentration near the bottom surface of the second electrode 304 is lower than that near the bottom surface of the first electrode 303. Therefore, when a voltage is applied to each electrode, a depletion layer is more likely to expand near the bottom surface of the second electrode 304 than near the bottom surface of the first electrode 303. As a result, the electrical thickness of the second insulating film 302b formed under the second electrode 304 is increased, whereby the second MOS type capacitor 311 becomes a capacitor having a suppressed leakage current. On the other hand, since the electrical thickness of the first insulating film 302a formed under the first electrode 303 is small, the first MOS type capacitor 310 becomes a capacitor having a high capacitance value. Accordingly, by using the manufacturing method of the semiconductor device according to this embodiment, the low leakage current capacitor and the high capacitance capacitor can be formed on the same substrate without performing a complicated process such as varying the film thickness between the first insulating film 302a and the second insulating film 302b. As a result, a semiconductor device showing excellent capability can be relatively easily manufactured.

Second Embodiment

Figure 4A:
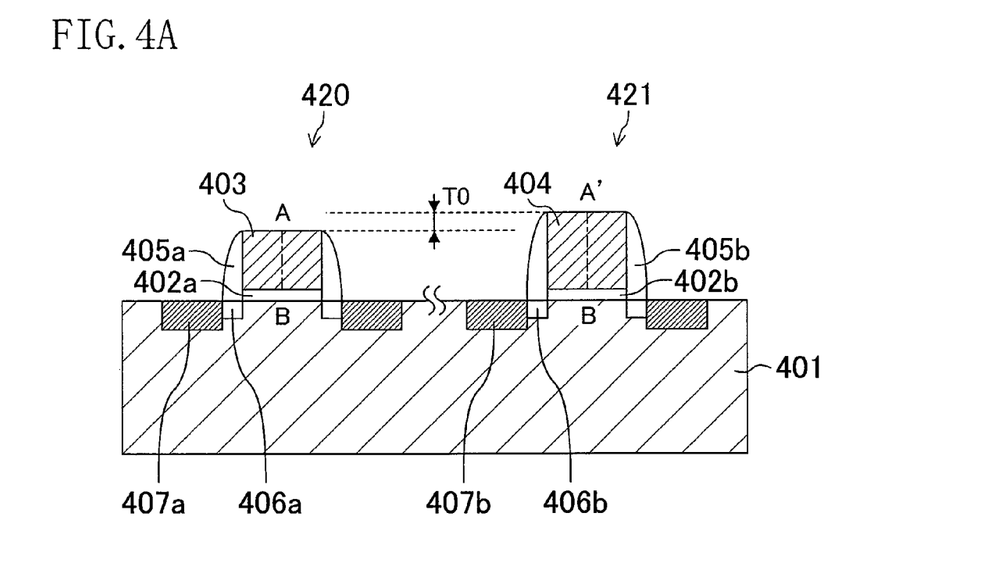
FIG. 4A is a cross-sectional view showing a structure of a semiconductor device according to a second embodiment of the invention.

Hereinafter, a semiconductor device and a manufacturing method thereof according to a second embodiment of the invention will be described with reference to the figures. FIG. 4A shows a structure of the semiconductor device of this embodiment. Note that the structure of the semiconductor device of this embodiment is only partially different from that of the semiconductor device of the first embodiment. Therefore, the same portions will be described briefly.

As shown in FIG. 4A, the semiconductor device of this embodiment includes a semiconductor substrate 401, and a first MOS type capacitor 420 and a second MOS type capacitor 421 that are formed on the semiconductor substrate 401. The first MOS type capacitor 420 includes a first insulating film 402a, a first electrode 403, a sidewall 405a, an impurity region 406a, and a high concentration impurity region 407a. The first insulating film 402a is formed on the semiconductor substrate 401 and the first electrode 403 is formed on the first insulating film 402a. The sidewall 405a is formed on the respective side surfaces of the first insulating film 402a and the first electrode 403. The impurity region 406a and the high concentration impurity region 407a are respectively formed beside the first electrode 403 and the sidewall 405a in the semiconductor substrate 401 when viewed two-dimensionally. Similarly, the second MOS type capacitor 421 includes a second insulating film 402b, a second electrode 404, a sidewall 405b, an impurity region 406b, and a high concentration impurity region 407b. The second insulating film 402b is formed on the semiconductor substrate 401 and the second electrode 404 is formed on the second insulating film 402b. The sidewall 405b is formed on the respective side surfaces of the second insulating film 402b and the second electrode 404. The impurity region 406b and the high concentration impurity region 407b are respectively formed beside the second electrode 404 and the sidewall 405b in the semiconductor substrate 401 when viewed two-dimensionally.

Figure 4B:
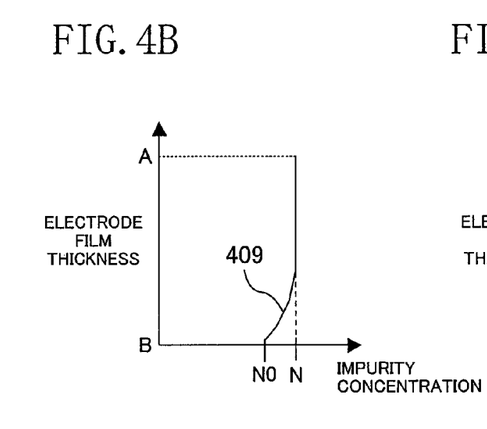
FIGS. 4B and 4C show impurity concentration distribution in a first electrode and a second electrode of the second embodiment, respectively.
Figure 4C:
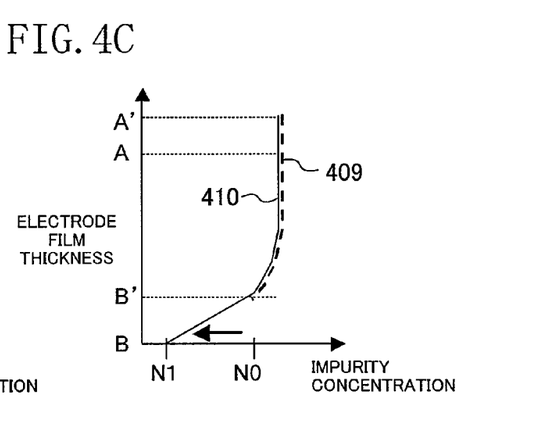

In the semiconductor device of this embodiment, the thickness of the first electrode 403 is smaller than that of the second electrode 404 by, for example, T0. Impurity concentration distribution in the first electrode 403 and the second electrode 404 will now be described with reference to FIGS. 4B and 4C. FIG. 4B shows an impurity concentration distribution 409 between A and B of the first electrode 403 shown in FIG. 4A. FIG. 4C shows an impurity concentration distribution 410 between A' and B of the second electrode 404 shown in FIG. 4A. For comparison between the impurity concentration distributions 409 and 410, the impurity concentration distribution 409 in the first electrode 403 is shown also in FIG. 4C.

As shown in FIG. 4B, the first electrode 403 of the first MOS type capacitor 420 has approximately the same impurity concentration from the top to a position near the center. The impurity concentration hardly changes in this region. However, the impurity concentration gradually reduces from the position near the center toward the bottom. Provided that N is an impurity concentration at the top surface (A) and N0 is an impurity concentration at the bottom surface (B), N and N0 have, for example, the following values: $N=2\times10^{20}/cm^3$ and $N0=1\times10^{20}/cm^3$. In this case, the concentration difference (first concentration difference) when the impurity concentration N0 at the bottom surface (B) is subtracted from the impurity concentration N at the top surface (A) is about $1\times10^{20}/cm^3$.

As shown in FIG. 4C, in the second electrode 404, an impurity concentration distribution in the region between the top surface and the position located lower than the top surface by the thickness of the first electrode 403 (the region between A' and B') is the same as the impurity concentration distribution 409 of the first electrode 403. However, the impurity concentration is significantly reduced near the bottom surface (the region between B' and B). Provided that N1 is an impurity concentration at the bottom surface of the second electrode 404, N1 has, for example, the following value: $N1=1\times10^{19}/cm^3$. In this case, the impurity concentration N1 at the bottom surface (B) of the second electrode 404 is lower than the impurity concentration N0 at the bottom surface (B) of the //first electrode 403 by about $9\times10^{19}/cm^3$. In other words, the concentration difference (second concentration difference) when the impurity concentration at the bottom surface (B) of the second electrode 404 is subtracted from the impurity concentration at the top surface (A') of the second electrode 404 is larger than the concentration difference (first concentration difference) when the impurity concentration at the bottom surface (B) of the first electrode 403 is subtracted from the impurity concentration at the top surface (A) of the first electrode 403.

The semiconductor device of this embodiment is characterized in that the thickness of the first electrode 403 is smaller than that of the second electrode 404. In this case, when impurities are introduced into the first electrode 403 and the second electrode 404, the impurities are less likely to reach near the lower surface of the second electrode 404 having a larger thickness. Therefore, when a voltage is applied to each electrode, a depletion layer is more likely to expand near the bottom surface of the second electrode 404 (an interface region of the second electrode 404 and the second insulating film 402b) than near the bottom surface of the first electrode 403 (an interface region of the first electrode 403 and the first insulating film 402a). As a result, the electrical thickness of the second insulating film 402b is increased, whereby the first MOS type capacitor 420 becomes a capacitor having a high capacitance value and the second MOS type capacitor 421 becomes a capacitor having a suppressed leakage current. Accordingly, a semiconductor device having a high capacitance capacitor and a low leakage current capacitor on the same substrate and showing excellent capability can be implemented according to this embodiment.

Figure 5A:
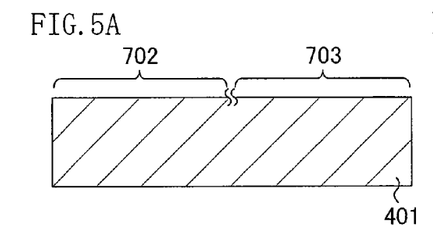
FIGS. 5A, 5B, 5C, 5D, 5E, 5F, 5G, 5H, and 5I are cross-sectional views illustrating a method for manufacturing a semiconductor device according to the second embodiment.

A manufacturing method of the semiconductor device having the above structure will now be described. FIGS. 5A through 5I are cross-sectional views illustrating the manufacturing method of the semiconductor device according to this embodiment. The manufacturing method of the semiconductor device of this embodiment is the same as that of the first embodiment (see FIGS. 2A through 2I) except the step shown in FIG. 5E. As shown in FIG. 5A, in the semiconductor device of this embodiment, the semiconductor substrate 401 has a first region 702 where a high capacitance capacitor is to be formed and a second region 703 where a low leakage current capacitor is to be formed.

Figure 5B:
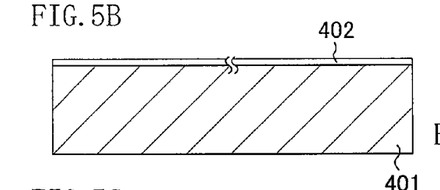
Figure 5C:
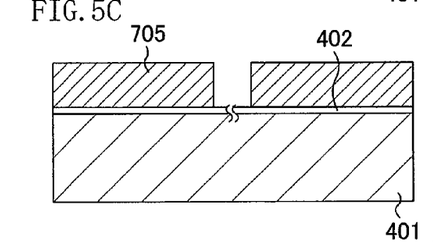

As shown in FIG. 5B, an insulating film 402 is first formed on the semiconductor substrate 401 by oxidation or the like. As shown in FIG. 5C, an electrode formation film 705 made of, for example, silicon is formed with a thickness of 200 nm on the insulating film 402.

Figure 5D:
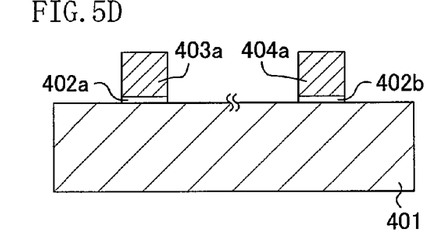

As shown in FIG. 5D, the insulating film 402 and the electrode formation film 705 are then patterned by lithography and dry etching to form a first insulating film 402a and a first electrode formation film 403a in the first region 702 and a second insulating film 402b and a second electrode formation film 404a in the second region 703.

Figure 5E:
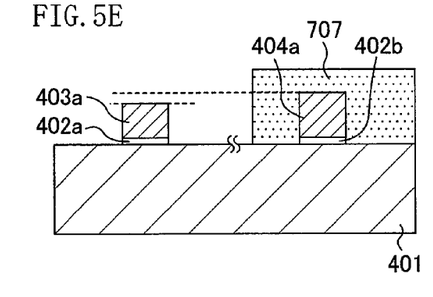

As shown in FIG. 5E, a resist pattern 707 is formed in the second region 703 so as to cover the second electrode formation film 404a and the second insulating film 402b. An upper portion of the first electrode formation film 403a in the first region 702 is then selectively removed by, for example, 30 nm by dry etching. As a result, the height of the top surface of the first electrode formation film 403a becomes lower than that of the top surface of the second electrode formation film 404a by 30 nm.

Figure 5F:
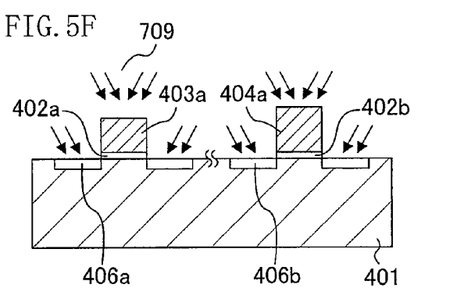

As shown in FIG. 5F, after the resist pattern 707 is removed, conductive impurities 709 such as arsenic or phosphorus are ion-implanted to the semiconductor substrate 401 to introduce the impurities 709 into the first electrode formation film 403a and the second electrode formation film 404a. At this time, the impurities 709 are introduced also into the regions respectively located beside the first electrode formation film 403a and the second electrode formation film 404a in the semiconductor substrate 401 when viewed two-dimensionally. As a result, impurity regions 406a and 406b are formed. Note that, the implantation conditions for arsenic are, for example, an implantation energy of 10 keV and a dose of $5\times10^{14}/cm^2$.

Figure 5G:
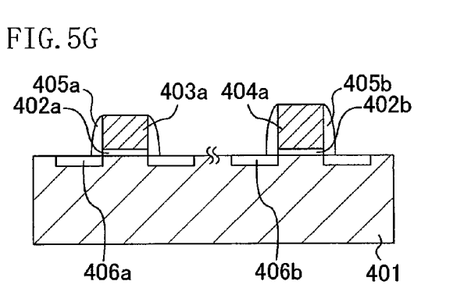

As shown in FIG. 5G, after an insulating film is formed over the whole surface of the semiconductor substrate 401, the insulating film is selectively removed by dry etching to form sidewalls 405a and 405b. The sidewall 405a is formed on the respective side surfaces of the first electrode formation film 403a and the first insulating film 402a, and the sidewall 405b is formed on the respective side surfaces of the second electrode formation film 404a and the second insulating film 402b.

Figure 5H:
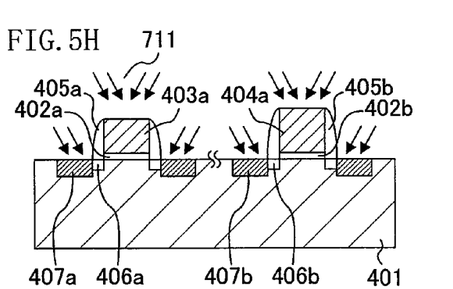

As shown in FIG. 5H, conductive impurities 711 such as arsenic or phosphorus are then ion-implanted to the semiconductor substrate 401 to further introduce the conductive impurities 711 into the first electrode formation film 403a and the second electrode formation film 404a. The first electrode formation film 403a and the second electrode formation film 404a thus become conductive electrodes. The ion implantation conditions for arsenic are, for example, an implantation energy of 20 keV and a dose of $5\times10^{15}/cm^2$. The impurities 711 are thus implanted at a larger dose than in the step of FIG. 5F. In this step, the impurities 711 are introduced also into the regions respectively located beside the first electrode formation film 403a and the second electrode formation film 404a in the semiconductor substrate 401 when viewed two-dimensionally. As a result, high concentration impurity regions 407a and 407b are formed.

Figure 5I:
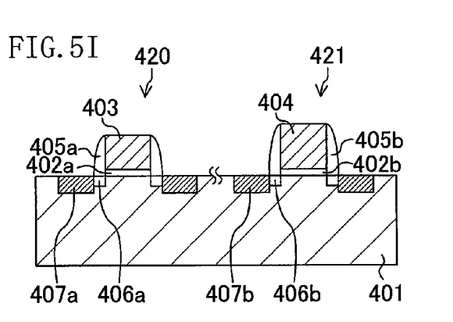

Finally, as shown in FIG. 5I, the semiconductor substrate 401 is subjected to heat treatment such as RTA at, for example, 1,000 degrees for 5 seconds to activate the impurities implanted in the first electrode formation film 403a, the second electrode formation film 404a, and each region. As a result, a first electrode 403 is formed on the first insulating film 402a in the first region 702, and a second electrode 404 is formed on the second insulating film 402b in the second region 703.

The semiconductor device of this embodiment having a high capacitance capacitor (first MOS type capacitor 420) and a low leakage current capacitor (second MOS type capacitor 421) in the first region 702 and the second region 703, respectively, can thus be manufactured by the above method. The first electrode 403 and the second electrode 404 have the same impurity concentration distribution as that shown in FIGS. 4B and 4C, respectively.

The manufacturing method of the semiconductor device according to this embodiment is characterized in that the upper portion of the first electrode formation film 403a is selectively removed in the step of FIG. 5E. The first electrode formation film 403a thus becomes thinner than the second electrode formation film 404a. Therefore, when impurities are ion-implanted to the first electrode formation film 403a and the second electrode formation film 404a in the steps of FIGS. 5F and 5H, the impurities implanted to the second electrode formation film 404a having a larger thickness are less likely to reach the interface region with the second insulating film 402b. Therefore, when a voltage is applied to each electrode, a depletion layer is more likely to expand near the bottom surface of the second electrode 404 than near the bottom surface of the first electrode 403. As a result, the electrical thickness of the second insulating film 402b becomes larger than that of the first insulating film 402a, whereby the first MOS type capacitor 420 becomes a capacitor having a high capacitance value and the second MOS type capacitor 421 becomes a capacitor having a suppressed leakage current. Accordingly, by using the manufacturing method of the semiconductor device according to this embodiment, the low leakage current capacitor and the high capacitance capacitor can be formed on the same substrate without performing a complicated process such as varying the film thickness between the first insulating film 402a and the second insulating film 402b. As a result, a semiconductor device showing excellent capability can be relatively easily manufactured.

Third Embodiment

Figure 6A:
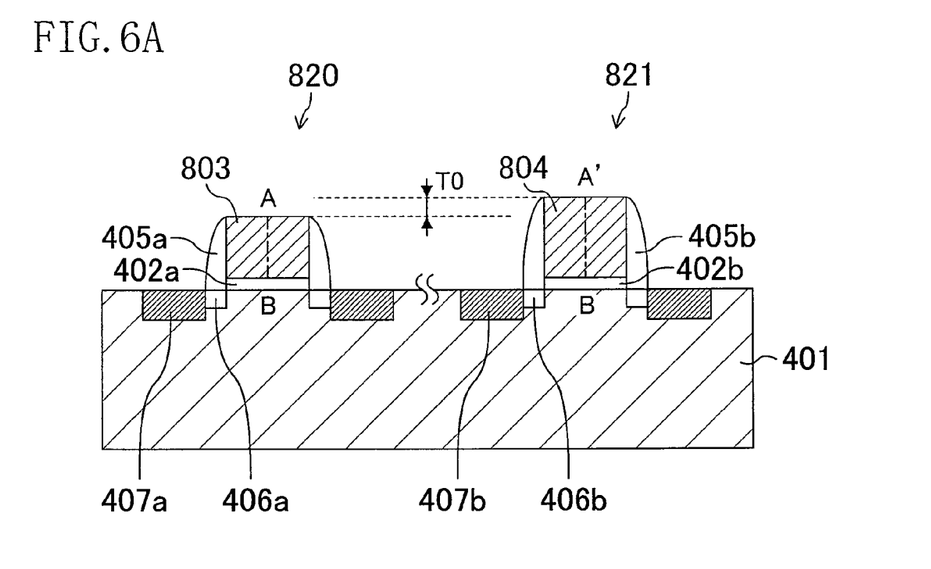
FIG. 6A is a cross-sectional view showing a structure of a semiconductor device according to a third embodiment of the invention.

Hereinafter, a semiconductor device and a manufacturing method thereof according to a third embodiment of the invention will be described with reference to the figures. FIG. 6A is a cross-sectional view showing a structure of the semiconductor device of this embodiment. As shown in FIG. 6A, the structure of the semiconductor device of this embodiment is the same as that of the semiconductor device of the second embodiment (see FIG. 4A). Therefore, description thereof will be omitted.

Figure 6B:
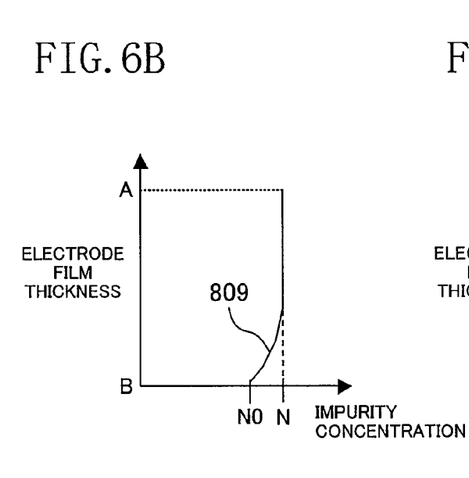
FIGS. 6B and 6C show impurity concentration distribution in a first electrode and a second electrode of the third embodiment, respectively.
Figure 6C:
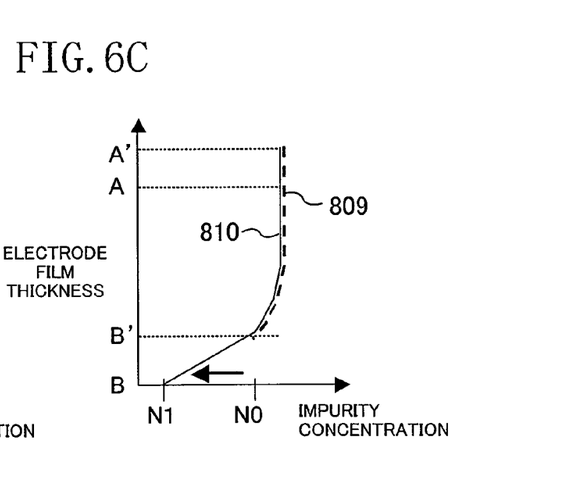

As shown in FIG. 6A, the semiconductor device of this embodiment includes a semiconductor substrate 401, and a first MOS type capacitor 820 and a second MOS type capacitor 821 that are formed on the semiconductor substrate 401. Like the semiconductor device of the second embodiment, the thickness of a first electrode 803 is smaller than that of a second electrode 804 by, for example, T0. Accordingly, as shown in FIGS. 6B and 6C, the first electrode 803 and the second electrode 804 have the same impurity concentration distribution as that of the first electrode 403 and the second electrode 404 in the semiconductor device of the second embodiment, respectively. Therefore, the concentration description distributions will be only briefly described.

FIG. 6B shows an impurity concentration distribution 809 between A and B of the first electrode 803 shown in FIG. 6A. FIG. 6C shows an impurity concentration distribution 810 between A' and B of the second electrode 804 shown in FIG. 6A. For comparison between the impurity concentration distributions 809 and 810, the impurity concentration distribution 809 in the first electrode 803 is shown also in FIG. 6C.

As shown in FIGS. 6B and 6C, in the second electrode 804, the impurity concentration distribution in the region between the top surface and the position located lower than the top surface by the thickness of the first electrode 803 (the region between A' and B') is the same as an impurity concentration distribution 809 of the first electrode 803. An impurity concentration N1 ($=1\times10^{19}/cm^3$) at the bottom surface (B) of the second electrode 804 is lower than an impurity concentration N0 ($=1\times10^{20}/cm^3$) at the bottom surface (B) of the first electrode 403 by about $10\times10^{19}/cm^3$. In other words, the concentration difference (second concentration difference) when the impurity concentration at the bottom surface (B) of the second electrode 804 is subtracted from the impurity concentration at the top surface (A') of the second electrode 804 is larger than the concentration difference (first concentration difference) when the impurity concentration at the bottom surface (B) of the first electrode 803 is subtracted from the impurity concentration at the top surface (A) of the first electrode 803.

Figure 7A:
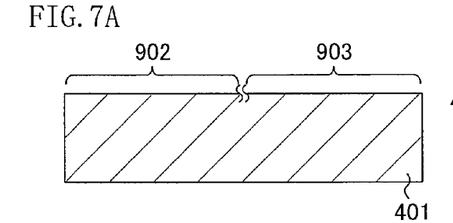
FIGS. 7A, 7B, 7C, 7D, 7E, 7F, 7G, 7H, and 7I are cross-sectional views illustrating a method for manufacturing a semiconductor device according to the third embodiment of the invention.

A manufacturing method of the semiconductor device having the above structure will now be described. FIGS. 7A through 7I are cross-sectional views illustrating the manufacturing method of the semiconductor device according to this embodiment. The manufacturing method of the semiconductor device of this embodiment is the same as that of the second embodiment (see FIGS. 5A through 5I) except the steps shown in FIGS. 7E and 7G. The material and thickness of each film and the ion implantation conditions are also the same as those of the manufacturing method of the second embodiment. Note that, as shown in FIG. 7A, in the semiconductor device of this embodiment, the semiconductor substrate 401 has a first region 902 where a high capacitance capacitor is to be formed and a second region 903 where a low leakage current capacitor is to be formed.

Figure 7B:
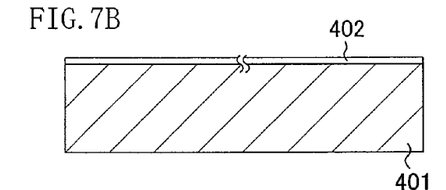
Figure 7C:
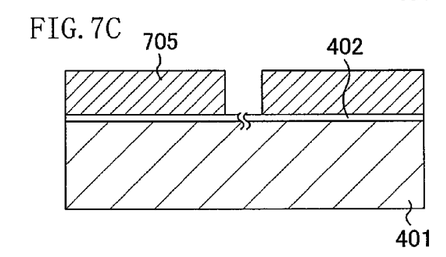

As shown in FIG. 7B, an insulating film 402 is first formed on the semiconductor substrate 401 by oxidation or the like. As shown in FIG. 7C, an electrode formation film 705 made of, for example, silicon is formed with a thickness of 200 nm on the insulating film 402.

Figure 7D:
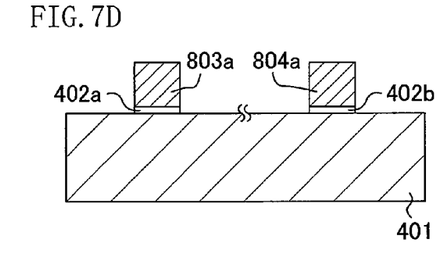

As shown in FIG. 7D, the insulating film 402 and the electrode formation film 705 are then patterned by lithography and dry etching to form a first insulating film 402a and a first electrode formation film 803a in the first region 902 and a second insulating film 402b and a second electrode formation film 804a in the second region 903.

Figure 7E:
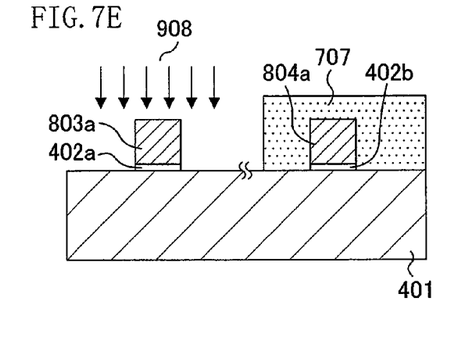

As shown in FIG. 7E, a resist pattern 707 is formed in the second region 903 so as to cover the second insulating film 402b and the second electrode formation film 804a. Impurities 908 such as germanium are then ion-implanted to the first region 902 at, for example, an implantation energy of 5 keV or less and a dose of $1\times10^{15}/cm^2$ or more. As a result, germanium is distributed at a high concentration at the surface of the first electrode formation film 803a. Note that the impurities 908 for ion implantation are not limited to germanium, and the same effects as those of germanium can be obtained by using indium or antimony for ion implantation.

Figure 7F:
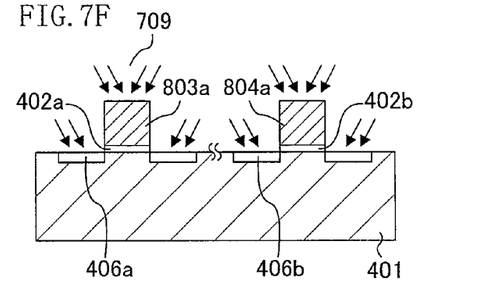

As shown in FIG. 7F, after the resist pattern 707 is removed, conductive impurities 709 such as arsenic or phosphorus are ion-implanted to the semiconductor substrate 401 to introduce the impurities 709 into the first electrode formation film 803a and the second electrode formation film 804a. At this time, the impurities 709 are introduced also into the regions respectively located beside the first electrode formation film 803a and the second electrode formation film 804a in the semiconductor substrate 401 when viewed two-dimensionally. As a result, impurity regions 406a and 406b are formed.

Figure 7G:
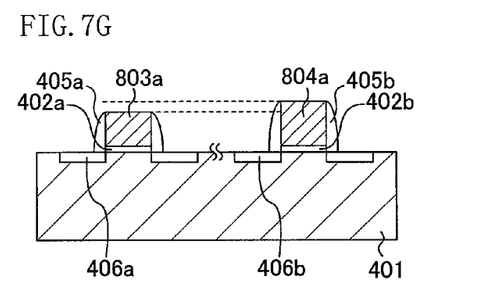

As shown in FIG. 7G, after an insulating film is formed over the whole surface of the semiconductor substrate 401, the insulating film is selectively removed by dry etching to form sidewalls 405a and 405b. The sidewall 405a is formed on the respective side surfaces of the first electrode formation film 803a and the first insulating film 402a, and the sidewall 405b is formed on the respective side surfaces of the second electrode formation film 804a and the second insulating film 402b. Since the high-concentration impurities 908 have been introduced into the upper portion of the first electrode formation film 803a in the step of FIG. 7E, the upper portion of the first electrode formation film 803a is removed with the insulating film by the dry etching process. Therefore, the height of the top surface of the first electrode formation film 803a becomes lower than that of the top surface of the second electrode formation film 804a by, for example, 30 nm.

Figure 7H:
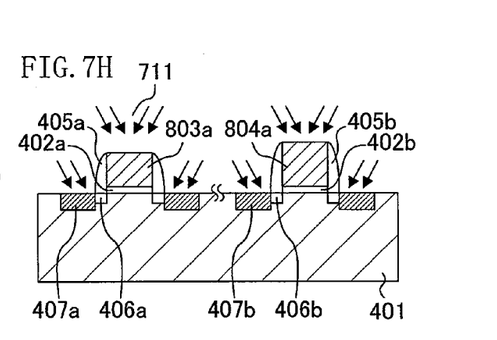

As shown in FIG. 7H, conductive impurities 711 such as arsenic or phosphorus are then ion-implanted to the semiconductor substrate 401 to further introduce the conductive impurities 711 into the first electrode formation film 803a and the second electrode formation film 804a. The first electrode formation film 803a and the second electrode formation film 804a thus become conductive electrodes. In this step, the impurities 711 are introduced also into the regions respectively located beside the first electrode formation film 803a and the second electrode formation film 804a in the semiconductor substrate 401 when viewed two-dimensionally. As a result, high concentration impurity regions 407a and 407b are formed.

Figure 7I:
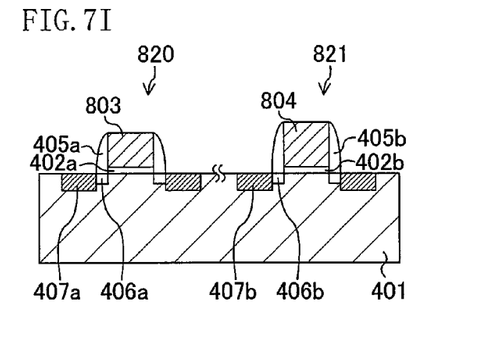

Finally, as shown in FIG. 7I, the semiconductor substrate 401 is subjected to heat treatment such as RTA at, for example, 1,000 degrees for 5 seconds to activate the impurities implanted in the first electrode formation film 803a, the second electrode formation film 804a, and each region. As a result, a first electrode 803 is formed on the first insulating film 402a in the first region 902, and a second electrode 804 is formed on the second insulating film 402b in the second region 903.

A semiconductor device having a high capacitance capacitor (first MOS type capacitor 820) and a low leakage current capacitor (second MOS type capacitor 821) in the first region 902 and the second region 903, respectively, can thus be manufactured by the above method. The first electrode 803 and the second electrode 804 have the same impurity concentration distribution as that shown in FIGS. 6B and 6C, respectively.

The manufacturing method of the semiconductor device according to this embodiment is characterized in that the impurities 908 such as germanium are ion-implanted to the first electrode formation region 803a in the step of FIG. 7E. As a result, the impurities 908 are distributed at a high concentration in the surface portion of the first electrode formation film 803a, and the surface portion of the first electrode formation film 803a has a higher etch rate. Therefore, the upper portion of the first electrode formation film 803a is removed with the unnecessary insulating film in the step of FIG. 7G. The first electrode formation film 803a thus becomes thinner than the second electrode formation film 804a. Therefore, when the impurities 711 are introduced in the step of FIG. 7H, the impurities 711 implanted to the second electrode formation film 804a having a larger thickness are less likely to reach the interface region with the second insulating film 402b. Therefore, when a voltage is applied to each electrode, a depletion layer is more likely to expand near the bottom surface of the second electrode 804 than near the bottom surface of the first electrode 803. As a result, the electrical thickness of the second insulating film 402b becomes larger than that of the first insulating film 402a. Accordingly, by using the manufacturing method of the semiconductor device according to this embodiment, the first MOS type capacitor 820 having a high capacitance value and the second MOS type capacitor 821 having a suppressed leakage current can be formed on the same substrate without performing a complicated process such as varying the thickness of the insulating film between the electrodes. As a result, a semiconductor device showing excellent capability can be relatively easily manufactured.

Figure 8:
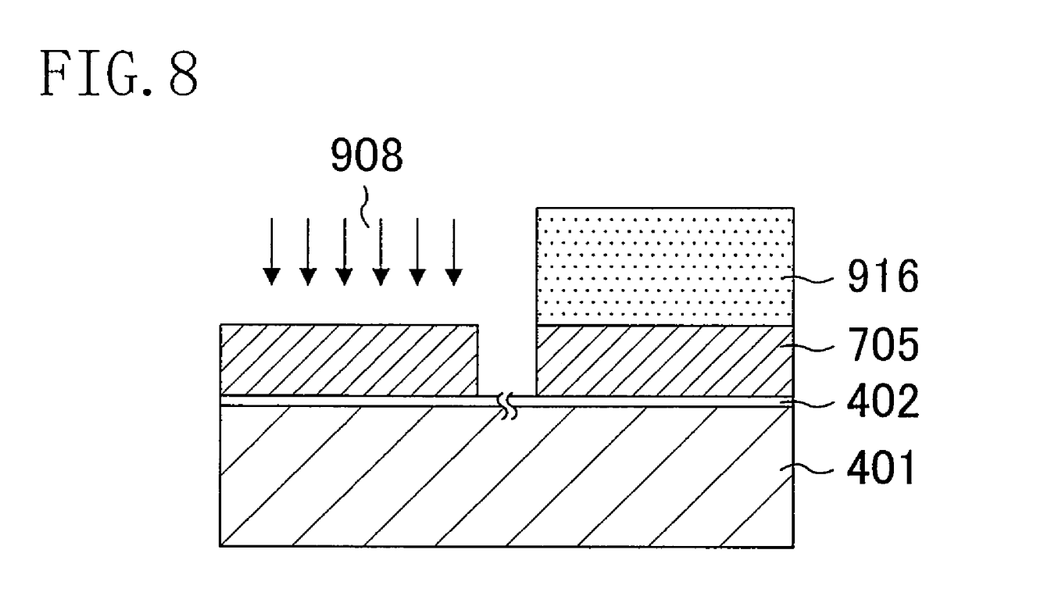
FIG. 8 is a cross-sectional view illustrating a modification of the method for manufacturing a semiconductor device according to the third embodiment.

In a modification of the manufacturing method of the semiconductor device of this embodiment, instead of the step of FIG. 7E, the step shown in FIG. 8 may be performed between the steps of FIGS. 7C and 7D. FIG. 8 is a cross-sectional view showing a modification of the manufacturing method of the semiconductor device according to this embodiment.

As shown in FIG. 8, after the insulating film 402 and the electrode formation film 705 are formed on the semiconductor substrate 401, a resist pattern 916 is formed on the electrode formation film 705 in the second region 903. Impurities 908 such as germanium are then ion-implanted to the electrode formation film 705 in the first region 902.

As shown in FIG. 7D, after the resist pattern 916 is removed, the first insulating film 402a and the first electrode formation film 803a as well as the second insulating film 402b and the second electrode formation film 804a are formed by lithography and dry etching. A semiconductor device according to this embodiment shown in FIG. 6A can be manufactured by sequentially performing the steps shown in FIGS. 7F through 7I thereafter.

In the semiconductor device and the manufacturing method thereof according to this invention, the first electrode and the second electrode may include a metal. In this case, a higher operation speed of the semiconductor device can be obtained in addition to the above effects.

Note that the first insulating film and the second insulating film may be made of a metal oxide such as HfOx (including HfSiO, HfSiON and the like), ZrOx, and TaOx. In this case, by using a high dielectric constant material as the insulating films, a MOS type capacitor having a further suppressed leakage current can be implemented.

In the manufacturing method of the semiconductor device according to the invention, arsenic and phosphorus are used as impurity ions in the step of performing ion implantation to form a high concentration impurity region. However, the invention is not limited to this, and boron, $BF_2$ or the like may be used.

As has been described above, the semiconductor device and the manufacturing method thereof according to the invention are useful to improve performance of the semiconductor device having a MOS type capacitor.

What is claimed is:

1. A semiconductor device, comprising:
a semiconductor substrate; and
a first MOS type capacitor including a first insulating film formed on the semiconductor substrate, and a first electrode formed on the first insulating film and including silicon, the first electrode having a first concentration difference as a difference when an impurity concentration in an interface region with the first insulating film is subtracted from an impurity concentration in a top portion of the first electrode; and
a second MOS type capacitor including a second insulating film formed on the semiconductor substrate, and a second electrode formed on the second insulating film and including silicon, the second electrode having a second concentration difference as a difference when an impurity concentration in an interface region with the second insulating film is subtracted from an impurity concentration in a top portion of the second electrode, wherein:
the second concentration difference is larger than the first concentration difference,
a thickness of the first electrode is smaller than a thickness of the second electrode, and
in the second electrode, an impurity concentration distribution between a top surface and a position located lower than the top surface by the thickness of the first electrode is the same as an impurity concentration distribution of the first electrode.

2. The semiconductor device according to claim 1, wherein the first electrode and the second electrode include a metal.

3. The semiconductor device according to claim 1, wherein the first insulating film and the second insulating film are made of a metal oxide.

4. The semiconductor device according to claim 1, wherein the first insulating film and the second insulating film have a same thickness.

5. The semiconductor device according to claim 1, wherein the impurity included in the first electrode is arsenic.

6. The semiconductor device according to claim 1, wherein the impurity included in the first electrode is phosphorous.

7. The semiconductor device according to claim 1, wherein the impurity included in the second electrode is arsenic.

8. The semiconductor device according to claim 1, wherein the impurity included in the second electrode is phosphorous.

9. The semiconductor device according to claim 1, wherein the impurity included in the first electrode is boron.

10. The semiconductor device according to claim 1, wherein the impurity included in the first electrode is $BF_2$.

11. The semiconductor device according to claim 1, wherein the impurity included in the second electrode is boron.

12. The semiconductor device according to claim 1, wherein the impurity included in the second electrode is $BF_2$.

13. The semiconductor device according to claim 1, wherein the first insulating film is made of $HfO_x$.

14. The semiconductor device according to claim 1, wherein the first insulating film is made of $ZrO_x$.

15. The semiconductor device according to claim 1, wherein the first insulating film is made of $TaO_x$.

16. The semiconductor device according to claim 1, wherein the second insulating film is made of $HfO_x$.

17. The semiconductor device according to claim 1, wherein the second insulating film is made of $ZrO_x$.

18. The semiconductor device according to claim 1, wherein the second insulating film is made of $TaO_x$.

* * * * *